United States Patent [19]

Ohashi

[11] Patent Number: 5,025,447
[45] Date of Patent: Jun. 18, 1991

[54] DRIVE CIRCUIT AND METHOD FOR SETTING A CONTROL SIGNAL OF A SEMICONDUCTOR LASER

[75] Inventor: Tsuyoshi Ohashi, Hashima, Japan

[73] Assignee: Brother Kogyo Kabushiki Kaisha, Nagoya, Japan

[21] Appl. No.: 577,016

[22] Filed: Sep. 4, 1990

[30] Foreign Application Priority Data

Sep. 12, 1989 [JP] Japan .................................. 1-237584

[51] Int. Cl.$^5$ ............................................. H01S 3/10
[52] U.S. Cl. ......................................... 372/31; 372/29
[58] Field of Search ............................... 372/31, 29, 38

[56] References Cited

U.S. PATENT DOCUMENTS 4,733,398  3/1988  Shibagaki et al. ..................... 372/31
4,928,284  5/1990  Burns ................................... 372/31

*Primary Examiner*—James W. Davie
*Attorney, Agent, or Firm*—Oliff & Berridge

[57] ABSTRACT

A semiconductor laser drive circuit comprises a control circuit, an addition circuit, a conversion drive circuit, and an optical output determination circuit. The control circuit starts the control operation upon receiving a control command from the exterior. First, the control circuit sends a control signal at the median of a predetermined control range. Second, the control circuit determines if an optical output of the semiconductor laser corresponding to the median control signal is greater than or equal to the predetermined value. Third, based upon the determination result, it is determined whether the greater half or the lesser half of the control range is searched. Then, the control signal at the median of the determined half of the initial control range is sent and the corresponding optical output is generated for searching thereof. A predetermined number of such binary-tree search operations are carried out and the median of the last-searched control range is determined as a desired control signal.

17 Claims, 5 Drawing Sheets

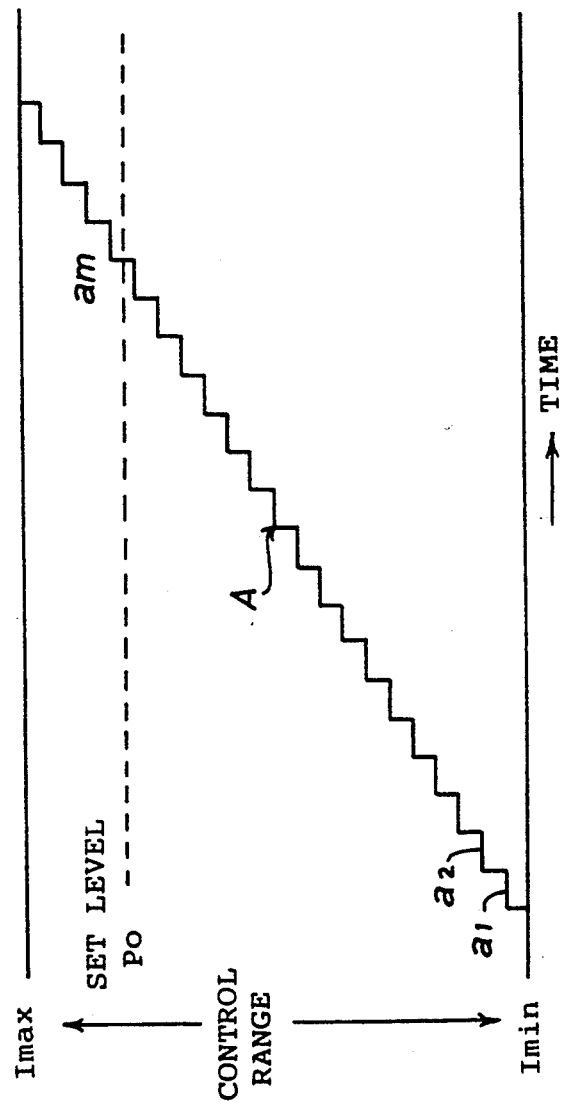

DRIVE CIRCUIT AND METHOD FOR SETTING A CONTROL SIGNAL OF A SEMICONDUCTOR LASER

BACKGROUND OF THE INVENTION

The present invention relates to a semiconductor laser drive circuit. More particularly, the present invention relates to a semiconductor laser drive circuit that modulates the value of optical output of a semiconductor laser in accordance with an externally provided modulation signal and controls the value of optical output of a semiconductor laser drive circuit based on an externally provided control command.

Related art

As well known in the art, in a semiconductor laser drive circuit that drives a semiconductor laser to generate optical output in accordance with an externally provided modulation signal, the value of the optical output is controlled based on control commands.

Conventionally, as shown in the block diagram of FIG. 4, a related art semiconductor laser drive circuit comprises a control circuit 1, an addition circuit 2, a conversion drive circuit 3, a semiconductor laser 4, and an optical output determination circuit 5 for determining the value of optical output of the semiconductor laser 4.

The control circuit 1 generates a control signal corresponding to a threshold value current of the semiconductor laser 4, which varies according to the temperature of the semiconductor laser 4, and sends the control signal to the addition circuit 2. Upon receiving an externally provided control signal, the control circuit 1 also sends a step control signal as shown in FIG. 5. The step control signal controls the value of optical output of the semiconductor laser 4. The addition circuit 2 adds an externally provided modulation signal and the control signal from the control circuit 1 and sends the resulting added signal to the conversion drive circuit 3. The conversion drive circuit 3 converts the added signal from the addition circuit 2 into a semiconductor laser drive current for driving the semiconductor laser 4. The optical output determination circuit 5 determines whether the optical output value of the semiconductor laser 4 is greater or smaller than a predetermined value and sends the result of the determination to the control circuit 1.

As soon as a control signal is sent to the control circuit 1 from the exterior, a conversion signal is set at a greatest possible value. At the same time, the control circuit 1 sends a step control signal from a minimum value of a predetermined drive current control range, starting the following controlling operation.

As shown in FIG. 5, the optical output of the semiconductor laser 4 is set at a level Po. Meanwhile, the maximum drive current level of this control is set at Imax and, likewise, the minimum drive current level is set at Imin, thus setting a predetermined control range. Then, the control circuit 1 generates a step control signal A which increases its value by 1/n of the predetermined control range at each step.

The semiconductor laser is driven to generate an optical output by a drive current corresponding to a control signal $a_1$ which is greater than the minimum drive current level Imin by (Imax−Imin)/n. The optical output determination circuit 5 determines if the optical output value is at the set level Po or less. If the optical output value is determined to be less than the set level Po at this step, the control operation continues the determination operation at a control signal $a_2$. This optical output determination operation is repeatedly carried out at each step of the control signal A until a mth control signal am (m is an integer not more than n.) exceeds the predetermined set level Po.

At this point, the control circuit 1 terminates the control operation. Until another control command is given, the control circuit 1 controls the operation of the semiconductor laser 4 by sending the control signal am.

The above semiconductor laser drive circuit necessitates m times of current settings and optical output determination operations until the step control signal A increases from Imin by steps and reaches the mth control signal am where the optical output value of the semiconductor laser 4 becomes the predetermined set level Po, and terminates the control operation. This type of control operation, therefore, is quite time-consuming.

Furthermore, the control is carried out within a predetermined control range at resolution of 1/n; if the resolution is enhanced by increasing the number n in order to improve the accuracy of the control operation, the control becomes more time-consuming. Thus, to improve the accuracy of the control is difficult. Moreover, this type of control has the disadvantage that the time required for carrying out the control can vary very much from one control operation to another.

SUMMARY OF THE INVENTION

An object of the present invention made to overcome the above-identified problem is to provide a semiconductor laser drive circuit that can control the optical output of a semiconductor laser with high accuracy in a short time period.

In order to realize the above object, a semiconductor laser drive circuit of the present invention comprises: a control circuit for sending a control signal to control the value of optical output of a semiconductor upon receiving an externally provided control command; an addition circuit for adding an externally provided modulation signal and the control signal sent from the control circuit; a conversion drive circuit for converting the signal added by the addition circuit into a drive current for driving the semiconductor laser; and an optical output determination circuit determining whether the optical output of the semiconductor laser is greater than or equal to, or smaller than a predetermined value and sending the result of the determination to the control circuit, wherein the control circuit, upon receiving a control command from the exterior, designates a control signal by carrying out a predetermined number of binary-tree searches of a predetermined current range based upon the result of the determination.

The control circuit starts the control operation upon receiving a control command from the exterior. First, the control circuit sends a control signal at the median of a predetermined control range. Second, the control circuit determines if an optical output of the semiconductor laser corresponding to the median control signal is greater than or equal to the predetermined value. Third, based upon the determination result, it is determined whether the greater half or the lesser half of the control range is searched. Then, the control signal at the median of the determined half of the initial control range is sent and the corresponding optical output is generated for searching thereof. A predetermined number of such binary-tree search operations are carried out, and the median of the last-searched control range is determined as a desired control signal.

In operation, to achieve resolution of $2^n$ of the control carried out based upon a control command, all that is required is n times of current settings and determination operations of the optical output level. Therefore, the time required for the control is significantly reduced. Furthermore, more accurate control at higher resolution can be facilitated with only a small increase of time necessary for the control operation.

BRIEF DESCRIPTION OF THE ATTACHED DRAWINGS

FIG. 5 is a graph showing the control operation of the conventional semiconductor laser drive circuit of FIG. 4.

PREFERRED EMBODIMENT OF THE INVENTION

Figure 1:
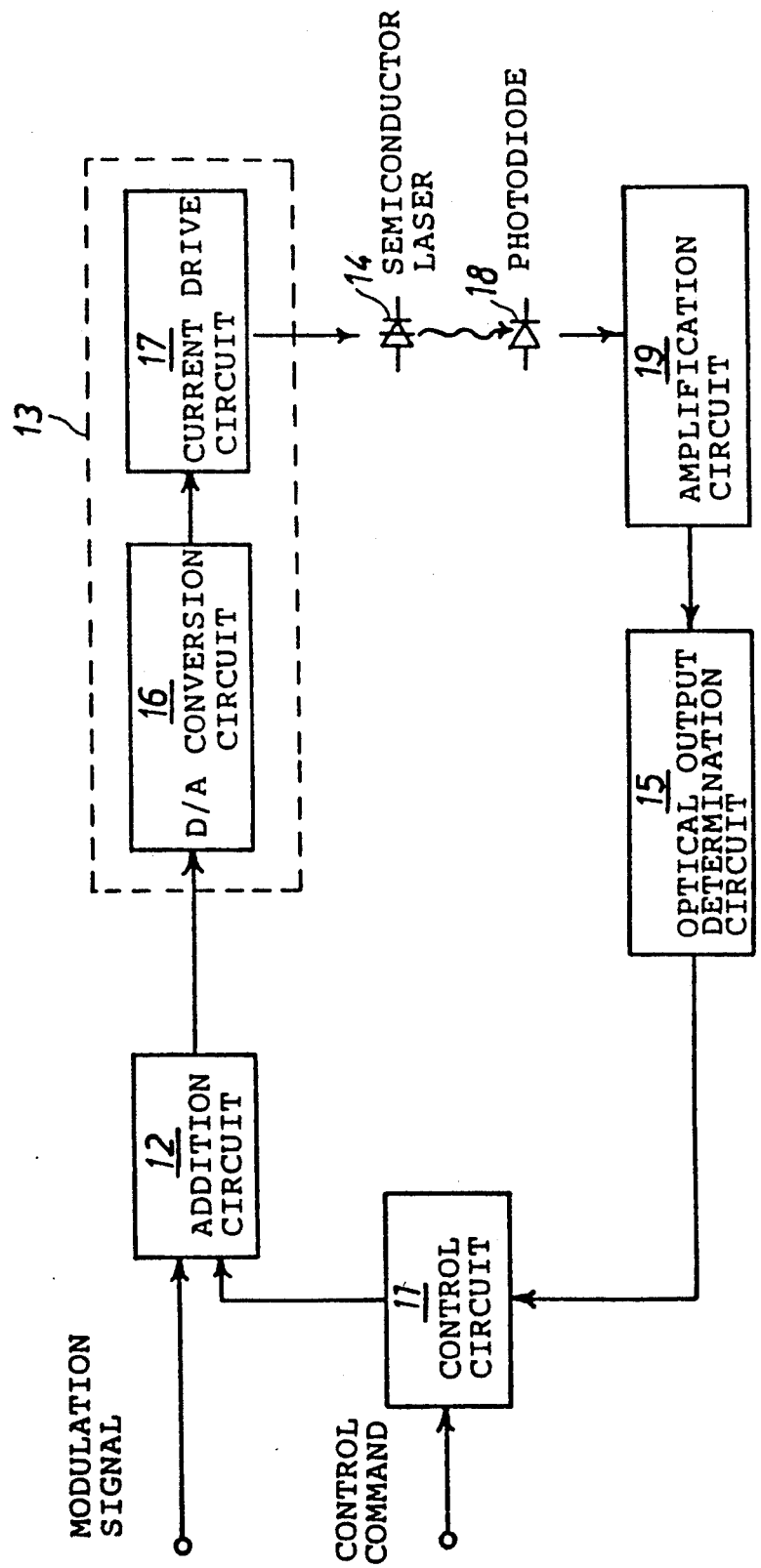
FIG. 1 is a block diagram of a semiconductor laser drive circuit embodying the present invention.
Figure 2:
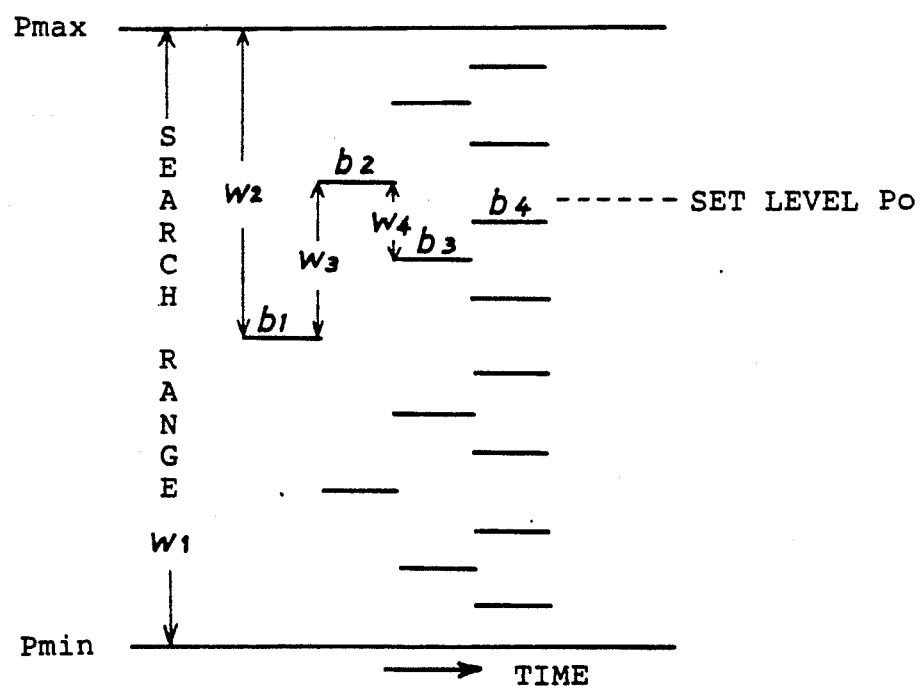
FIG. 2 is a graph showing a binary-tree search of a control circuit of the semiconductor of FIG. 1.
Figure 3:
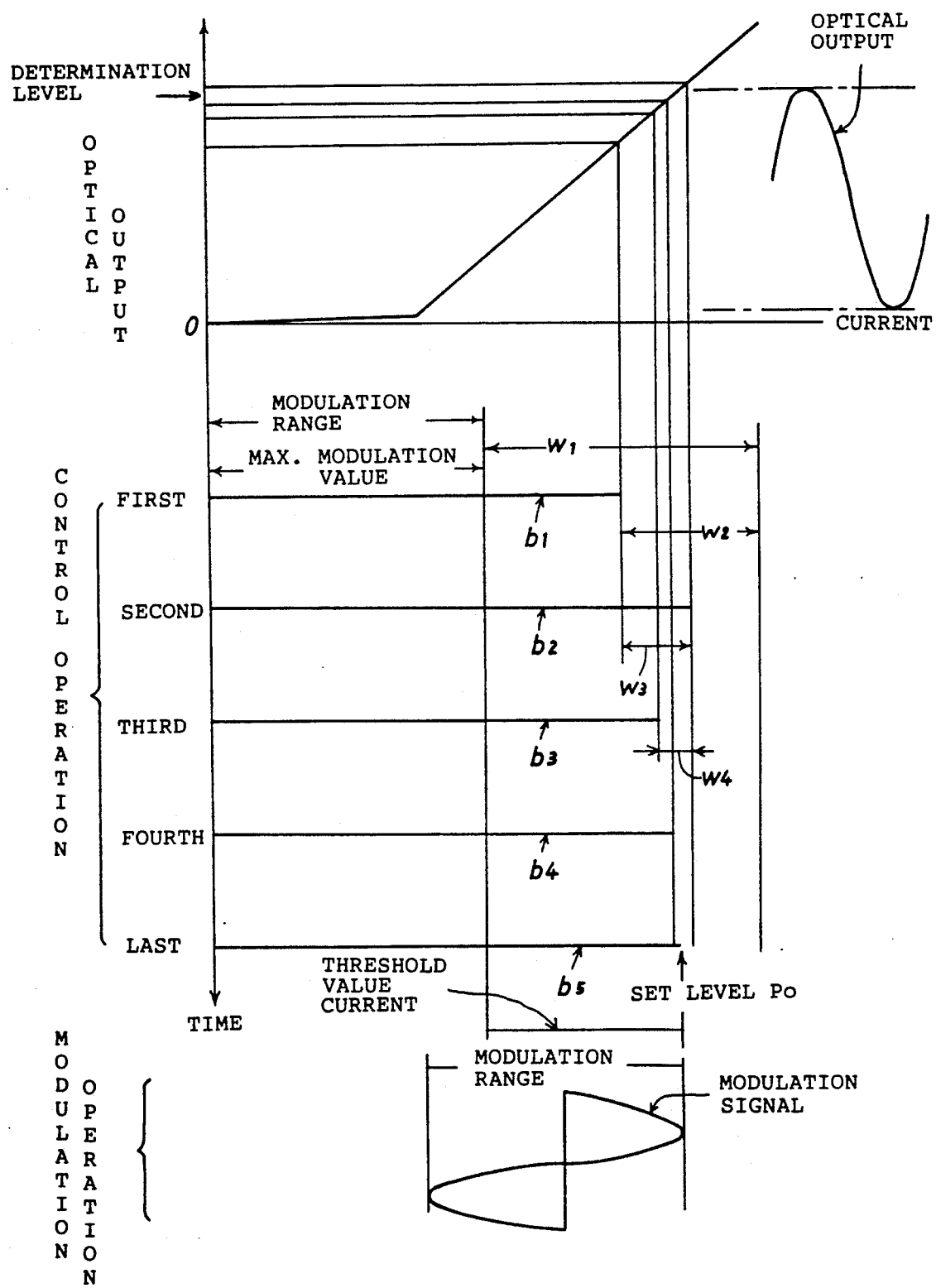
FIG. 3 is a graph showing characteristics of optical output and drive current of a semiconductor laser of FIG. 1, and the operation of binary-tree search for optical out put.

Referring to FIGS. 1–3, a semiconductor laser drive circuit embodying the present invention will be explained hereinafter.

Figure 4:
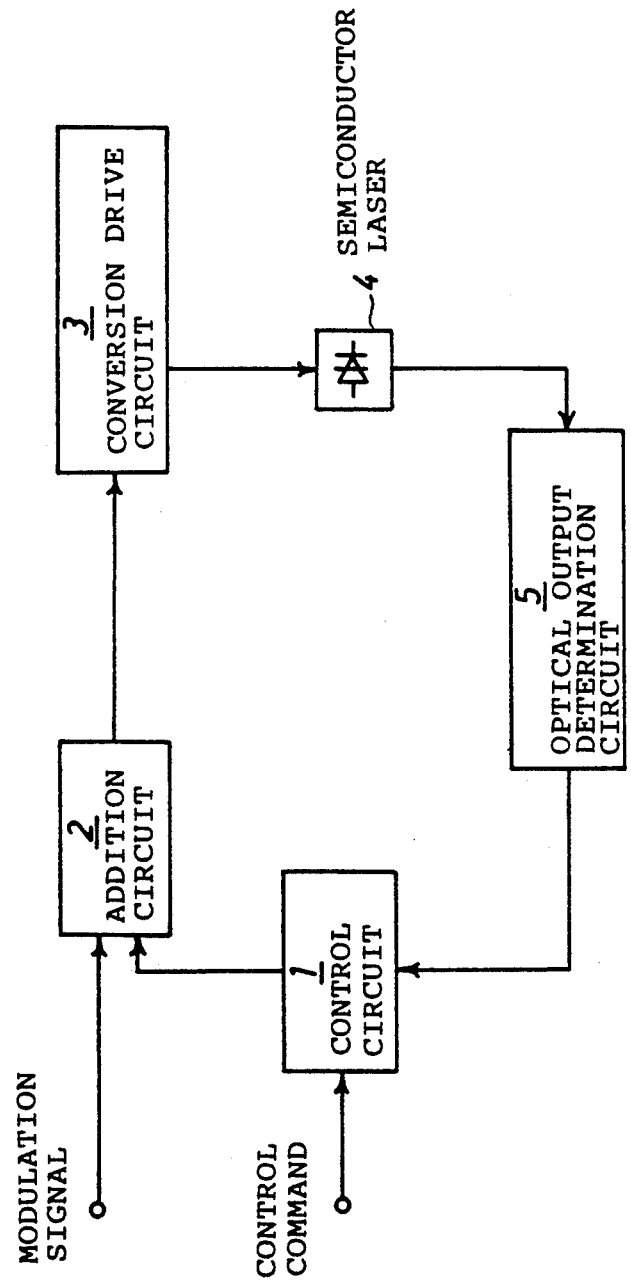
FIG. 4 is a block diagram of a conventional semiconductor laser drive circuit.

Since some elements of the semiconductor laser drive circuit of the present embodiment are identical to the corresponding elements of the conventional semiconductor laser drive circuit of FIG. 4, explanation thereof, which has been given above, is dispensed with below.

A conversion drive circuit 13 comprises a D/A conversion circuit 16 for converting output signal from an addition circuit 12 into analog signal and a current drive circuit 17 for driving a semiconductor laser in accordance with the converted analog sent from the D/A conversion circuit 16. Optical output of a semiconductor laser 14 is detected by a photodiode connected to the semiconductor laser by photocoupling, amplified by an amplification circuit 19, and sent to an optical output detection circuit 15.

First, a control circuit 11 generates a control signal corresponding to a threshold value current of the semiconductor laser 14. The control signal is added to an externally provided modulation signal to drive the semiconductor laser 14. Upon receiving an externally provided control command, the control circuit determines the level of, by binary-tree search, and generates a control signal which controls the optical output of the semiconductor laser 14.

An example of the control operation involving four binary-tree searches performed by the control circuit 11 will be explained with specific reference to FIGS. 2 and 3 hereinafter.

As soon as a control command, which is sent from the exterior, is received by the control circuit 11, a modulation signal is set, for example, to its maximum modulation value by a not-shown means. Now, the control circuit 11 carries out four binary-tree searches within a predetermined drive current control range (referred to as the search range hereinafter). A first search range $W_1$ ranges from a minimum set current Imin to the maximum set current Imax. Upon receiving a control command, the control circuit 11 generates a first control signal $b_1$ at the median of the search range $W_1$. The first control signal $b_1$ is added to the maximum modulation signal and sent to the conversion drive circuit 13 to current-drive the semiconductor laser 14. Then, information in the form of the optical output of the semiconductor laser 14 converted from current to light is sent to the optical output determination circuit 15, which determines whether or not the optical output is greater than a predetermined set level Po. The determination result is sent to the control circuit 11. If the optical output is less than the predetermined set level Po, the next search range searched by the control circuit 11 is the greater half of the first search range $W_1$ between the median and the maximum set current Imax. If, on the other hand, the optical output is determined to be greater than the set level Po, the next search range is the lower half of the first search range $W_1$ between the median and the minimum set current Imin.

In this example, as shown in FIGS. 2 and 3, the optical output is determined to be smaller than the set level Po. Therefore, the second search range $W_2$ is the greater half of the first search range $W_1$ between the median of the first search range $W_1$ and the maximum set current Imax.

In the second binary-tree search, the control circuit 11 generates a second control signal $b_2$ at the median of the second search range $W_2$. Then, the optical output of the semiconductor laser 14 corresponding to the second control signal $b_2$ is compared with the set level Po. The next search range, either the greater or the lesser half of the second search range $W_2$, is determined based upon the determination result. In this example, since the optical output is determined to be greater than the set level Po, a third binary-tree search is conducted within a third search range $W_3$, which is the lower half of the second search range $w_2$.

In the third binary-tree search, the control circuit 11 generates a control signal $b_3$ at the median of the third search range $W_3$. A fourth search range $W_4$ is determined based upon the determination result of the optical output generated by the semiconductor laser 14. If the third binary-tree search determines that the optical output is less than the set level Po, the greater half of the third search range $W_3$ between the third control signal $b_3$ and the control signal $b_2$ is designated as a fourth search range $W_4$.

In the fourth binary-tree search, the control circuit 11 generates a fourth control signal $b_4$ at the median of the fourth search range $W_4$.

As is clear in the foregoing explanation, the optical output of the semiconductor laser 14 effectively approaches the set level Po at each search. After the fourth binary-tree search, a fifth control signal $b_5$ is generated at the median of the fourth search range $W_4$ based upon the determination result, terminating this control operation. As shown in the lower part of FIG. 3, the control signal $b_5$ is substantially at the same level as the set level Po. The semiconductor laser 14 is driven by the addition of the fifth and last control signal $b_5$ and the external provided modulation signal. Until a next control command is given, the control circuit 11 does not carry out the above-explained control operation.

The cycle of control commands which instruct the control circuit 11 to carry out the above control is set such that a control signal can easily follow the fluctuation of the threshold value current corresponding to the temperature of fluctuation of the semiconductor laser 14.

Furthermore, the search range of the control circuit 11 narrows down to one half thereof at each binary-tree search. Therefore, n times of the search operations narrows a first search range down to $\frac{1}{2}^n$ thereof, achieving a control with resolution of $2^n$. The time required for achieving the control with the resolution of $2^n$ is no more than the time required for current setting and optical output determination of the n times of binary-tree searches.

Upon completion of n times of binary-tree searches, the nth control signal at the median of the nth search range is added to a maximum modulation signal and the semiconductor laser 14 generates the optical output corresponding to the added signal as described above. Only less than $\frac{1}{2}^{n+1}$ of the first search range is the error between this optical output and a different optical output which serves as a criterion for the determination performed by the optical output determination circuit 15. Since the optical output error decreases on the principle of exponential function, a highly accurate control can be achieved without taking a long time.

While the described embodiment represents the preferred form of the invention, it is to be understood that changes and variations may be made without departing from the spirit and the scope of the invention.

For example, a modulation signal is set at its maximum level during the control operation based upon an externally provided control command in the above embodiment. However, the modulation signal may be set at its median, its minimum, or any level in combination with the optical output determination circuit.

As the foregoing explanation shows, the semiconductor laser of the present invention realizes a significant reduction in the control operation time. Moreover, the time required for carrying out the control operation is standardized in accordance with the number of binary-tree searches to be conducted. These advantages are made possible by determining the control signal for controlling the optical output of the semiconductor laser by conducting several binary-tree searches of a predetermined drive current control range.

In accordance with the present invention, increase in determination resolution from $2^n$ to $2^{n+1}$ requires only one more binary-tree search, which takes little time. Thus, a highly accurate control at high resolution is easily obtained.

What is claimed is:

1. A semiconductor laser drive circuit comprising:
   control means for generating a control signal, where the control signal determines a range of output of the semiconductor laser; and
   determination means for determining whether an output of the semiconductor laser is greater than or less than a predetermined value and sending to the control means a determination result indicating whether the output of the semiconductor laser is greater than or less than the predetermined value; wherein
   upon receiving an externally provided control command, the control means generates a new control signal based on the determination result by generating a predetermined number of search control signals in a binary-tree search, the new control signal corresponding to the final search control signal.

2. The semiconductor laser drive circuit of claim 1, in which the control means executes the binary-tree search by generating search control signals at levels above or below previously generated search control signals, depending on the determination result.

3. The semiconductor laser drive circuit of claim 1, in which:
   the control means generates a search control signal at a level above a previously generated search control signal when the determination result indicates that the output of the semiconductor laser corresponding to the previously generated search control signal is less than the predetermined value; and
   the control means generates a search control signal at a level below a previously generated search control signal when the determination result indicates that the output of the semiconductor laser corresponding to the previously generated search control signal is greater than the predetermined value.

4. The semiconductor laser drive circuit of claim 1, in which:
   a minimum and a maximum of the output of the semiconductor laser define a search range $W_1$;
   the search range $W_1$ is divided into $2^n$ equal sub-ranges; and
   the predetermined number of search control signals is equal to n.

5. The semiconductor laser drive circuit of claim 4, in which:
   the control means generates search control signals successively numbered from $b_1$ through $b_n$;
   the control means generates a search control signal $b_n$ at a level above the level of search control signal $b_{n-1}$ when the determination result indicates that the output of the semiconductor laser corresponding to search control signal $b_{n-1}$ is greater than the predetermined value; and
   the control means generates a search control signal $b_n$ at a level below the level of search control signal $b_{n-1}$ when the determination result indicates that the output of the semiconductor laser corresponding to search control signal $b_{n-1}$ is less than the predetermined value.

6. The semiconductor laser drive circuit of claim 4, in which:
   each binary tree search contains n subsearches;
   each sub-search searches a search range $W_n$, where search range $W_n$ is one half of search range $W_{n-1}$ and the control means generates search control signals number $b_1$ through $b_n$ corresponding to each search range $W_1$ through search range $W_n$, respectively;
   search range $W_n$ is above the median of search range $W_{n-1}$ when the determination result indicates that the output of the semiconductor laser corresponding to search control signal $b_{n-1}$ is greater than the predetermined value; and
   search range $W_n$ is below the median of search range $W_{n-1}$ when the determination result indicates that the output of the semiconductor laser corresponding to search control signal $b_{n-1}$ is less than the predetermined value.

7. The semiconductor laser drive circuit of claim 6, in which search control signal $b_n$ is at the median of search range $W_n$.

8. A semiconductor laser drive circuit comprising:

control means for generating a control signal, where the control signal determines a range of output of the semiconductor laser;

adding means for generating an added signal by adding the control signal to an externally provided modulation signal;

conversion means for converting the added signal into a drive current for driving the semiconductor laser; and determination means for determining whether an output of the semiconductor laser is greater than or less than a predetermined value and sending to the control means a determination result indicating whether the output of the semiconductor laser is greater than or less than the predetermined value; wherein upon receiving an externally provided control command, the modulation signal is set to a predetermined modulation level and the control means generates a new control signal based on the determination result by generating a predetermined number of search control signals in a binary-tree search, the new control signal corresponding to the final search control signal.

9. The semiconductor laser drive circuit of claim 8, in which the control means executes the binary-tree search by generating search control signals at levels above or below previously generated search control signals, depending on the determination result.

10. The semiconductor laser drive circuit of claim 8, in which:

the control means generates a search control signal at a level above a previously generated search control signal when the determination result indicates that the output of the semiconductor laser corresponding to the previously generated search control signal is less than the predetermined value; and the control means generates a search control signal at a level below a previously generated search control signal when the determination result indicates that the output of the semiconductor laser corresponding to the previously generated search control signal is greater than the predetermined value.

11. The semiconductor laser drive circuit of claim 8, in which:

a minimum and maximum drive current correspond to a minimum and a maximum of the output of the semiconductor laser;

the minimum and the maximum of the output of the semiconductor laser define a search range $W_1$;

the search range $W_1$ is divided into $2^n$ equal sub-ranges; and the predetermined number of search control signals is equal to n.

12. The semiconductor laser drive circuit of claim 11, in which:

the control means generates search control signals successively numbered from $b_1$ through $b_n$;

the control means generates a search control signal $b_n$ at a level above the level of search control signal $b_{n-1}$ when the determination result indicates that the output of the semiconductor laser corresponding to search control signal $b_{n-1}$ is greater than the predetermined value; and the control means generates a search control signal $b_n$ at a level below the level of search control signal $b_{n-1}$ when the determination result indicates that the output of the semiconductor laser corresponding to search control signal $b_{n-1}$ is less than the predetermined value.

13. The semiconductor laser drive circuit of claim 11, in which:

each binary tree search contains n subsearches;

each sub-search searches a search range $W_n$, where search range $W_n$ is one half of search range $W_{n-1}$ and the control means generates search control signals number $b_1$ through $b_n$ corresponding to each search range $W_1$ through search range $W_n$, respectively;

search range $W_n$ is above the median of search range $W_{n-1}$ when the determination result indicates that the output of the semiconductor laser corresponding to search control signal $b_{n-1}$ is greater than the predetermined value; and search range $W_n$ is below the median of search range $W_{n-1}$ when the determination result indicates that the output of the semiconductor laser corresponding to search control signal $b_{n-1}$ is less than the predetermined value.

14. The semiconductor laser drive circuit of claim 13, in which search control signal $b_n$ is at the median of search range $W_n$.

15. A method of setting a new search control signal for controlling a semiconductor, comprising the steps of:

defining an initial search range between a minimum and a maximum output of the semiconductor laser;

setting a search control signal for controlling the semiconductor laser to generate an output substantially equal to the median of the search range;

controlling the semiconductor laser to generate an output corresponding to the search control signal;

comparing the output of semiconductor laser corresponding to search control signal with the predetermined value;

generating a higher or a lower result signal when the output of the semiconductor laser is higher or lower, respectively, than the predetermined value;

defining a new search range as one half of the previous search range above the median of the previous search range if a lower result signal is generated or one half of the previous search range below the median of the previous search range if a higher result signal is generated;

repeating, for a predetermined number of iterations, the steps of setting a search control signal, controlling the semiconductor laser, comparing the output of the semiconductor laser, generating a higher or a lower result signal, and defining a new search range; and setting a new control signal for determining a range of output of the semiconductor laser as the median of the last defined search range.

16. The method of setting a search control signal of claim 15, in which the initial search range is divided into $2^n$ sub-ranges, and the predetermined number of iterations is equal to n−1.

17. The method of setting a search control signal of claim 16, in which the step of controlling the semiconductor laser further comprises the steps of:

setting an externally provided modulation signal to a predetermined modulation level;

adding the search control signal to the externally provided modulation signal to generate an added signal; and generating a drive current from the added signal for driving the semiconductor laser.

* * * * *